US012568768B2

(12) United States Patent
Chen et al.

(10) Patent No.: US 12,568,768 B2
(45) Date of Patent: Mar. 3, 2026

(54) METHODS FOR FABRICATING MAGNETORESISTIVE RANDOM ACCESS MEMORY WITH VIA UNDER MJT

(71) Applicant: HeFeChip Corporation Limited, Hong Kong (CN)

(72) Inventors: Wei-Chuan Chen, Scarsdale, NY (US); Hong-Hui Hsu, Zhubei (TW); Chih-Yuan Lee, Taoyuan (TW); Yiheng Xu, Clifton Park, NY (US)

(73) Assignee: HEFECHIP CORPORATION LIMITED, Hong Kong (CN)

( * ) Notice: Subject to any disclaimer, the term of this patent is extended or adjusted under 35 U.S.C. 154(b) by 598 days.

(21) Appl. No.: 18/089,151

(22) Filed: Dec. 27, 2022

(65) Prior Publication Data

US 2024/0215457 A1 Jun. 27, 2024

(51) Int. Cl.
*H10N 50/01* (2023.01)
*H10B 61/00* (2023.01)
(Continued)

(52) U.S. Cl.
CPC ............. *H10N 50/01* (2023.02); *H10B 61/00* (2023.02); *H10N 50/10* (2023.02); *H10N 50/80* (2023.02)

(58) Field of Classification Search
CPC ........ H10N 50/01; H10N 50/80; H10N 50/10; H10B 61/00
(Continued)

(56) References Cited

U.S. PATENT DOCUMENTS 8,315,019 B1 * 11/2012 Mao ..................... G11B 5/3909
428/815
11,031,548 B2 6/2021 Shen et al.
(Continued)

FOREIGN PATENT DOCUMENTS

CN 106030841 A 10/2016
CN 108232000 A 6/2018
(Continued)

OTHER PUBLICATIONS

S. Van Beek et al., "Edge-induced reliability & performance degradation in STT-MRAM: an etch engineering solution," *2021 IEEE International Reliability Physics Symposium (IRPS)*, 2021, 5 pages.

*Primary Examiner* — Jami Valentine Miller
(74) *Attorney, Agent, or Firm* — Muncy, Geissler, Olds & Lowe, P.C.

(57) ABSTRACT

Methods for fabricating a magnetoresistive random access memory are disclosed. In this method, an MTJ stack is formed over a lower metal layer on a semiconductor substrate, and a first etching is then performed to form an MTJ component and to expose a portion of a bottom electrode layer or via beneath the MTJ stack. An oxidation process is then carried out to oxidize both a conductive redeposition on sidewalls of the MTJ component and a partial thickness of the exposed portion of the bottom electrode layer or via around the MTJ component. Subsequently, a second etching is conducted at an incident etching angle of smaller than 45°, which facilitates complete removal of the resulting sidewall oxide layer on the MTJ component, as well as damaged portions thereof which may degrade the performance of the MTJ component, ensuring reliability of the MTJ component.

14 Claims, 10 Drawing Sheets

(51) Int. Cl.
    *H10N 50/10*           (2023.01)
    *H10N 50/80*           (2023.01)

(58) Field of Classification Search
    USPC ........................................................ 257/421
    See application file for complete search history.

(56) References Cited

U.S. PATENT DOCUMENTS

| | | | |
|---|---|---|---|
| 2017/0148976 A1* | 5/2017 | Annunziata ............ | H10N 50/01 |
| 2020/0091411 A1* | 3/2020 | Sonoda .................. | H10N 50/80 |
| 2020/0403151 A1* | 12/2020 | Annunziata ............ | H10N 50/10 |

FOREIGN PATENT DOCUMENTS

| | | |
|---|---|---|
| CN | 110867513 A | 3/2020 |
| CN | 113451353 A | 9/2021 |

\* cited by examiner forming a first dielectric layer over a lower metal layer on a semiconductor substrate; forming a via extending through the first dielectric layer and a bottom electrode material layer filling the via and covering the first dielectric layer, wherein the bottom electrode material layer is connected to the lower metal layer through the via forming a magnetic tunnel junction (MTJ) stack on the bottom electrode material layer performing a first etching on the MTJ stack to form an MTJ device aligned with the via and to expose a portion of the bottom electrode material layer around the MTJ device, wherein a conductive redeposition is formed on sidewalls of the MTJ device during the first etching performing an oxidation process to form a sidewall oxide layer on each sidewall of the MTJ device by oxidizing the conductive redeposition and to form a bottom oxide layer around the MTJ device by oxidizing the exposed portion of the bottom electrode material layer around the MTJ device, wherein a portion of the bottom electrode material layer that is not oxidized and located beneath the MTJ device and the bottom oxide layer serves as a bottom electrode removing the sidewall oxide layer by a second etching, wherein the second etching is performed at an etching angle of smaller than 45°

Fig. 1

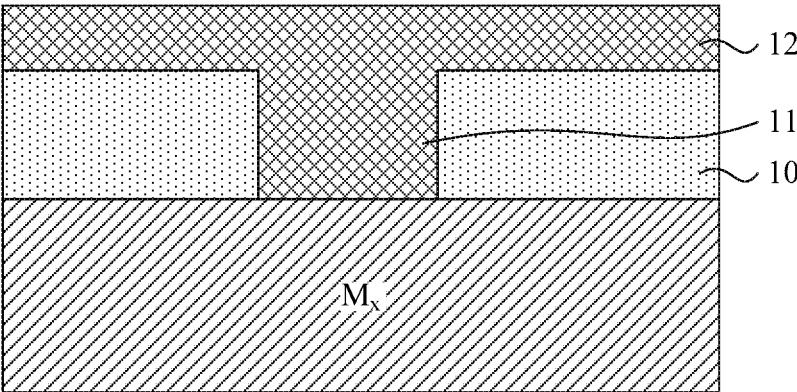

METHODS FOR FABRICATING MAGNETORESISTIVE RANDOM ACCESS MEMORY WITH VIA UNDER MJT

TECHNICAL FIELD

The present invention relates to the field of semiconductor technology and, in particular, to methods for fabricating a magnetoresistive random access memory.

BACKGROUND

Magnetoresistive random-access memory (MRAM) is a new type of non-volatile memory having a magnetic tunnel junction (MTJ) device as a main component. The MTJ component includes a stack of a pin layer, a tunneling barrier layer and a free layer. Typically, the pin layer has a fixed (or "pinned") magnetic orientation, while the free layer has a variable (or "free") magnetic orientation that can switch between two or more different magnetic polarities. Due to the magnetic tunnel effect, the electrical resistance of the MTJ component changes with the variable magnetic polarities. In operation, the spin-transfer torque (STT) effect can be utilized to cause magnetic polarity change or switch which enables storage of information.

In order to fabricate such MTJ components, a stack of layers for forming the MTJ components is usually first formed over a metal layer on a semiconductor substrate and then etched to form the respective isolated MTJ components. During the etching, some of the metal material will be redeposited to sidewalls of the MTJ components, possibly establishing a conduction path between the pin and free layers across the tunneling barrier layers in the MTJ components and hence generating short-circuit points in the MRAM being fabricated. In order to overcome this short-circuit problem caused by the metal material redeposited on the sidewalls of the MTJ components, U.S. Pat. No. 11,031, 548B2 discloses a method for reducing material intermixing on MTJ sidewalls by oxidation, in which a metal material redeposited on sidewalls of MTJ components is oxidized, followed by ion beam etching (IBE) to process the sidewalls of the MTJ components at a large incident etching angle (e.g., 50-90°) to remove the oxide layer on the sidewalls of the MTJ components, as well as damaged portions of the sidewalls of the MTJ components.

However, in MRAM devices of advanced process nodes, multiple MTJ components are laterally arranged on a semiconductor substrate at a small pitch, which would lead to a problem caused by shadowing when sidewalls of the MTJ components are etched at a large incident angle. When this happens, complete removal of the oxide layer and damaged portions from the sidewalls of the MTJ components would be difficult in the above method. This is inconducive to reliability of the resulting MTJ components.

SUMMARY OF THE INVENTION

The present invention provides methods for fabricating a magnetoresistive random access memory (MRAM) device with a reduced risk of short-circuit points and ensured reliability of MTJ components therein.

In one aspect, the present invention provides a method for fabricating at least one MRAM device, comprising:

forming a first dielectric layer over a lower metal layer on a semiconductor substrate; forming a via extending through the first dielectric layer and a bottom electrode layer filling the via and covering the first dielectric layer, wherein the bottom electrode layer is connected to the lower metal layer through the via;

forming a magnetic tunnel junction (MTJ) stack on the bottom electrode layer;

performing a first etching on the MTJ stack to form an MTJ component aligned with the via and to expose a portion of the bottom electrode layer around the MTJ component, wherein a conductive redeposition is formed on sidewall of the MTJ component during the first etching;

performing an oxidation process to form a sidewall oxide layer on each sidewall of the MTJ component by oxidizing the conductive redeposition and to form a bottom oxide layer around the MTJ component by oxidizing the exposed portion of the bottom electrode layer around the MTJ component, wherein a portion of the bottom electrode layer that is not oxidized and located beneath the MTJ component and the bottom oxide layer serves as a bottom electrode; and removing the sidewall oxide layer by a second etching, wherein the second etching is performed at an incident etching angle of smaller than 45°.

In another aspect, the present invention provides an MRAM device fabricated according to the above described method, comprising:

a first dielectric layer, formed over a lower metal layer on a semiconductor substrate;

a via, extending through the first dielectric layer;

a bottom electrode layer, filling the via and covering the first dielectric layer, wherein the bottom electrode layer is connected to the lower metal layer through the via;

a magnetic tunnel junction component, formed on the bottom electrode layer;

a hard mask, formed on the MTJ component;

a top electrode, formed above the hard mask and connected to the MTJ component;

an encapsulation material layer, formed on side walls of the MTJ component and an exposed surface of each of the bottom electrode layer and the first dielectric layer;

a second dielectric layer, formed on the encapsulation material layer, wherein the second dielectric layer covers a MTJ component and fills gaps around the MTJ component.

In another aspect, the present invention provides a method for fabricating at least one MRAM device, comprising:

forming a first dielectric layer over a lower metal layer on a semiconductor substrate and a via extending through the first dielectric layer;

forming a magnetic tunnel junction (MTJ) stack on the first dielectric layer;

performing a first etching on the MTJ stack to form an MTJ component aligned with a central region of the via and to expose a portion of the via around the MTJ component, wherein a conductive redeposition is formed on sidewalls of the MTJ component during the first etching;

performing an oxidation process to form a sidewall oxide layer on each sidewall of the MTJ component by oxidizing the conductive redeposition and to form a bottom oxide layer by oxidizing a portion of the via exposed around the MTJ component; and removing the sidewall oxide layers by performing a second etching on the MTJ component, wherein the second etching is performed at an incident etching angle of smaller than 45°.

In the methods provided in the present invention, an MTJ stack is formed over a lower metal layer on a semiconductor substrate, and a first etching is then performed to form an MTJ component and to expose a portion of a bottom electrode layer or via beneath the MTJ stack. An oxidation process is then carried out to oxidize both a conductive redeposition on sidewalls of the MTJ component and a portion of the exposed bottom electrode layer or via around the MTJ component. Subsequently, a second etching is conducted at an incident etching angle of smaller than 45° to remove the resulting sidewall oxide layer on the MTJ component. The small etching angle of the second etching can avoid the problem caused by shadowing and facilitate complete removal of the sidewall oxide layers on the MTJ component, as well as damaged portions therefrom which may degrade the performance of the MTJ component, ensuring reliability of the MTJ component. In addition, as the MTJ component is surrounded by the oxidized bottom electrode layer or via, etching byproducts redeposited on the sidewalls of the MTJ component during the second etching are non-conductive, reducing the risk of short-circuit points in the MRAM.

BRIEF DESCRIPTION OF THE DRAWINGS

FIG. 1 shows a flowchart of a method for fabricating a MRAM device according to an embodiment of the present invention.

FIGS. 2A to 2J are schematic cross-sectional views of structures resulting from multiple steps in a method for fabricating a MRAM device according to an embodiment of the present invention.

DETAILED DESCRIPTION

Figures 2B, 2C:
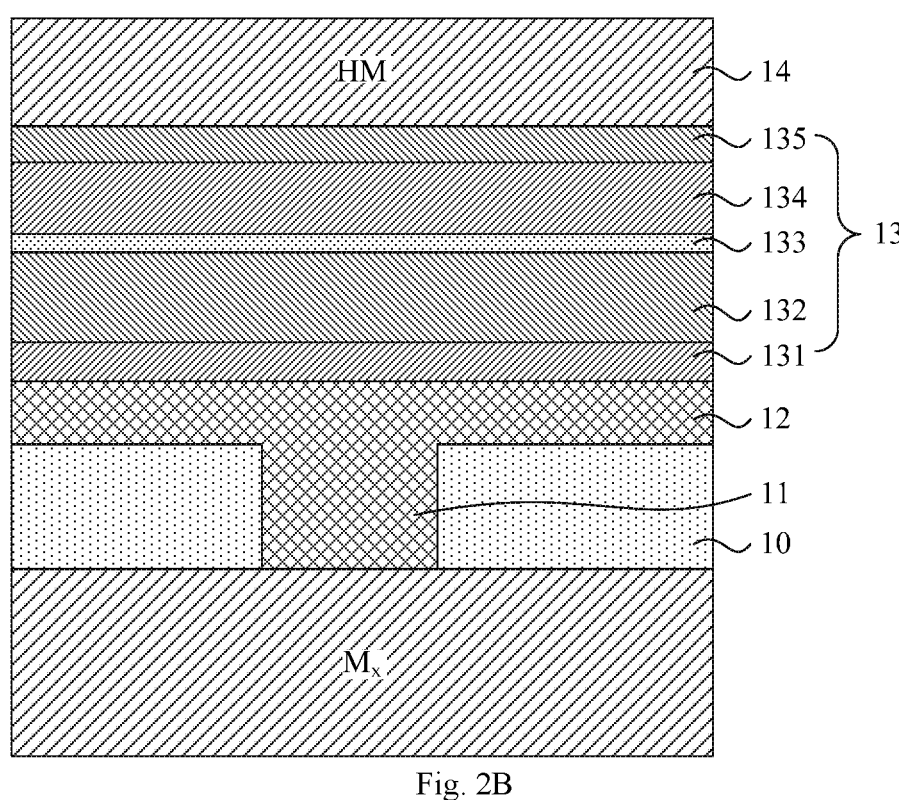

Methods for fabricating a magnetoresistive random access memory (MRAM) according to particular embodiments of the present invention will be described in greater detail below with reference to the accompanying drawings. Note that the figures are provided in a very simplified form not necessarily drawn to exact scale for the only purpose of facilitating easy and clear description of the embodiments. Additionally, the spatially relative terms are intended to encompass different orientations of the device in use or operation in addition to the orientation depicted in the figures. For example, if the device in the figures is inverted or otherwise oriented (e.g., rotated), the exemplary term "over" can encompass an orientation of "under" and other orientations. Throughout the drawings, if any component is identical to a labeled one, although such components may be easily identifiable in all the figures, in order for a more clear description of labels to be obtained, not all identical components are labeled and described in the following description and accompanying drawings.

In an MRAM, an MTJ component may be formed between adjacent metal layers over a semiconductor substrate. A multitude of such MTJ components, which are laterally arranged, may be formed between the adjacent metal layers. At advanced process nodes, these MTJ components would be spaced apart at a reduced distance (pitch). The aspect ratio of these MTJ components will be variations on the height of these MTJ components. In this case, due to the problem caused by shadowing for ion beam etching, it would be difficult to remove oxide layer on, and damaged portions of, sidewalls of the MTJ components by etching at a large incidence angle (e.g., 50-90°), which is defined as an angle between the ion beam incident direction and a normal of the semiconductor substrate. On the other hand, if a reduced incident etching angle is adopted, a conductive metal material exposed at the bottom of the gaps would be excessively etched and again redeposited on the sidewalls of the MTJ components, leading to a higher risk of short-circuit points in the MRAM.

Embodiments of the present invention relate to methods for fabricating at least one MRAM device, in which after an MTJ component is formed by etching an MTJ stack, a bottom electrode layer or a via beneath the MTJ stack is partially exposed. After that, an oxidation process is carried out to oxidize not only a conductive redeposition on sidewalls of the MTJ component but also a partial thickness of the exposed bottom electrode layer or via. The sidewalls of the MTJ component are then etched at a relatively small incidence angle (smaller than 45°). In this way, even when the MTJ component is surrounded by narrow gaps, it will be easy for an ion beam to access and remove the resulting sidewall oxide layer on and damages portions of the sidewalls of the MTJ component. Thus, reliability of the MTJ component can be ensured even at advanced process nodes. Through oxidizing a partial thickness of the exposed bottom electrode layer or via in the oxidation process, there is substantially no exposed metal material around the MTJ component. As a result, a redeposition formed on the sidewalls of the MTJ component in the small-angle etching comprises essentially an insulating material, reducing the risk of short-circuit points in the MRAM.

FIG. 1 shows a flowchart of a method for fabricating a MRAM device according to an embodiment of the present invention. FIGS. 2A to 2F are schematic cross-sectional views of structures resulting from multiple steps in a method for fabricating a MRAM according to an embodiment of the present invention. A method for fabricating at least one MRAM device according to an embodiment of the present invention will be described below with reference to FIGS. 1 and 2A to 2F. The MRAM is formed in a sandwich of metal layers that are circuit layers on a semiconductor substrate. In the following embodiments, the adjacent metal layers are referred to respectively as a lower metal layer and an upper metal layer.

As shown in FIG. 2A, at first, a first dielectric layer 10 is formed on the lower metal layer $M_x$ over the semiconductor substrate (not shown), and a via 11 extending through the first dielectric layer 10 is formed, and a bottom electrode (BE) material layer 12 fills the via 11 and covers the first dielectric layer 10. The bottom electrode layer 12 is connected to the lower metal layer $M_x$ by the via 11.

The lower metal layer $M_x$ may be a metal interconnect layer over the semiconductor substrate and is therefore labeled with the subscript "x". The first dielectric layer 10 may be made of, for example, undoped silicate glass, an oxide (e.g., silicon) or other suitable materials. The via 11 may include a metal material filling a through-hole in the first dielectric layer 10. The metal material may include one or a combination of two or more of Ta, TaN, Ti, TiN, W, Cu, CuCo, Ru and CoRu. The via 11 may have a size determined by the design of the MRAM. Here, the via 11 is a small-diameter plug, for example. In order to avoid from being exposed and etched during the subsequent second etching, a radial size of the via 11 may be, for example, smaller than a lateral size of an MTJ component to be formed on the via 11, or smaller than a lateral size of the bottom electrode in electrical contact with the MTJ component and the via 11. The bottom electrode layer 12 may include one or a combination of two or more of titanium nitride, tantalum nitride, titanium, tantalum and aluminum.

As shown in FIG. 2B, an MTJ stack 13 is then formed over the first dielectric layer 10. The MTJ stack 13 is intended to be processed to form the MTJ component which includes various functional layers required by the MTJ component. As an example, the MTJ stack 13 includes a seed layer (SL) 131, a pin layer (PL) 132, a tunneling barrier layer 133, a free layer (FL) 134 and a cap layer 135. These functional layers may be formed of known materials. For example, the tunneling barrier layer 133 may be formed of magnesium oxide (MgO). Following the formation of the MTJ stack 13, a hard mask (HM) layer 14 may be further deposited on the MTJ stack 13. The hard mask layer 14 is made of, for example, a metal material.

As shown in FIG. 2C, the hard mask layer 14 is then patterned by photolithography (e.g., reactive ion etching (RIE)) to define a location for the MTJ component. Here, the patterned hard mask layer 14 may serve as a top electrode connected to the MTJ component in the MRAM being fabricated.

Figure 2D:
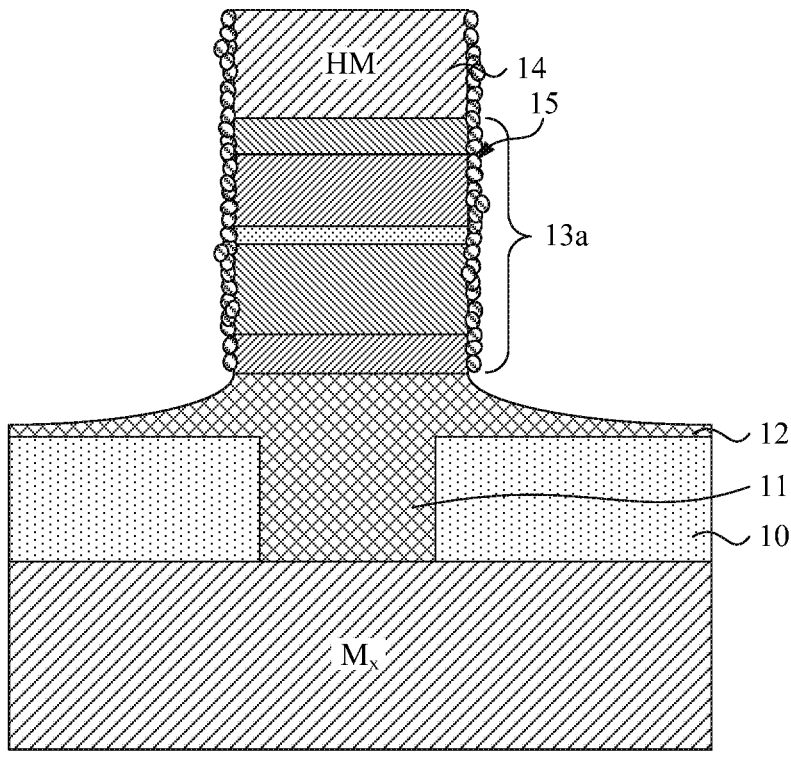

As shown in FIG. 2D, subsequently, with the patterned hard mask layer 14 serving as a mask, a first etching (which may include a proper degree of over-etching) is carried out to remove a portion of the MTJ stack 13, to form the MTJ component 13a aligned with the via 11. As another result of this first etching, a portion of the bottom electrode layer 12 not covered by the MTJ component 13a is exposed. The first etching may be implemented as a reactive ion etching (RIE) or ion beam etching (IBE) process, with an IBE process being preferred because of less introduction of chemical gas(es) therein. An incident etching angle of this first etching (which is defined as an angle between the ion beam incident direction and a normal of the semiconductor substrate; this also applies to the following description) is, for example, smaller than 30°. For example, it may be a vertical etching (performed at an etching angle of 0). Sidewalls of the MTJ component 13a are perpendicular to or nearly perpendicular to a top surface of the semiconductor substrate. In the first etching, a partial thickness of the bottom electrode layer 12 may be etched away. During the etching, the removed metal materials of the MTJ stack 13 and the bottom electrode layer 12, as well as, some etching byproducts, will be partially redeposited on sidewalls of the MTJ component 13a and the hard mask layer 14, leading to a conductive redeposition 15 on the sidewalls of the resulting MTJ component 13a. Moreover, the first etching may bring damage to the sidewalls of the MTJ component 13a. The conductive redeposition 15 on and such damaged portions of the sidewalls of the MTJ component 13a must be removed. Otherwise, they tend to cause the short-circuit and reliability problems as explained in the Background section.

Optionally, a plurality of vias 11 for connection of respective MTJ components 13a may be formed in the first dielectric layer 10 on the lower metal layer $M_x$. Accordingly, as a result of the first etching, MTJ components 13a are formed corresponding to the respective vias 11. That is, a plurality of MTJ components 13a are formed. In this case, portions of the bottom electrode layer 12 around the MTJ components 13a will be exposed between these MTJ components 13a. In order to avoid excessive etching of the first dielectric layer 10 during the subsequent second etching, which may affect the overall process on the semiconductor substrate, after the completion of the above-described first etching, the bottom electrode layer 12 remains unpenetrated between the MTJ components 13a. Referring to FIG. 2D, as a result of the first etching, the portions of the bottom electrode layer 12 surrounding the MTJ components 13a are thinner at locations farther away from the MTJ components 13a. As an example, the bottom electrode layer 12 may have a thickness at the thinnest portions (i.e., minimum thickness) that is smaller than or equal to 10 nm, more particular, for example, about 5 nm.

Figure 2E:
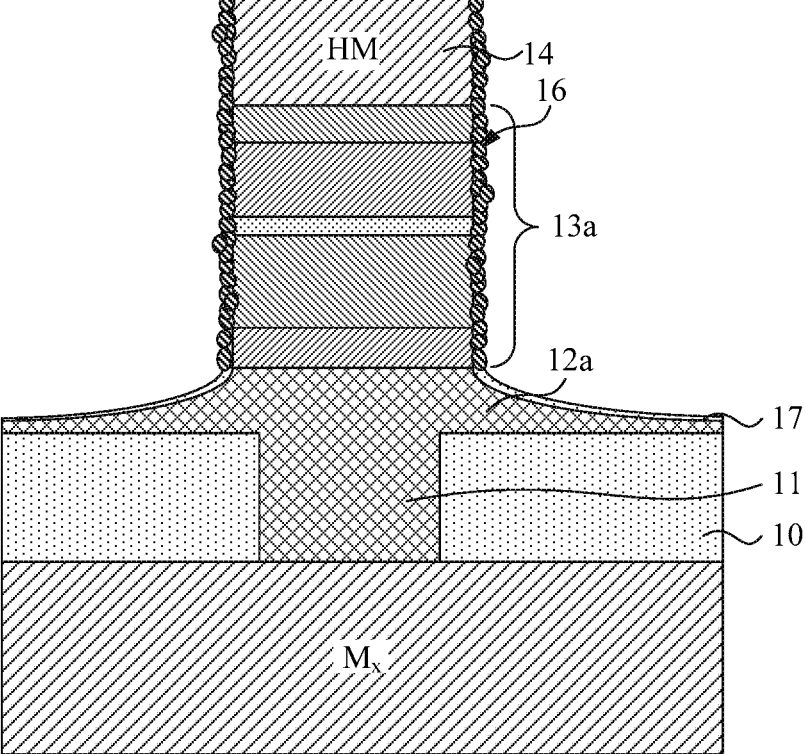

As shown in FIG. 2E, an oxidation process follows, in which, for example, oxygen ($O_2$), ozone ($O_3$), an inert gas containing oxygen ($O_2$) or ozone ($O_3$), or plasma is utilized to treat the semiconductor substrate that has undergone the first etching under or not under heating so that the conductive redeposition 15 on the sidewalls of the MTJ components 13a, as well as, any magnetic material in the MTJ components 13a exposed at the sidewalls thereof in the oxidizing atmosphere, is oxidized, resulting in the formation of sidewall oxide layers 16 on the sidewalls of the MTJ components 13a. The oxidation process may alternatively form a part of the first etching. The oxidation process also causes a partial thickness of the bottom electrode layer 12 to be oxidized from the surface thereof, resulting in the formation of a bottom oxide layer 17 around the MTJ components 13a. In this embodiment, at least the thinner portions of the bottom electrode layer 12 around the MTJ components 13a are totally oxidized in the oxidation process, thereby eliminating the connection between adjacent MTJ components 13a provided by the bottom electrode layer 13a. The thicker portions of the exposed bottom electrode layer 13a may not be totally oxidized. Rather, only a partial thickness around the surface of the thicker portions may be oxidized. The remaining portions of the bottom electrode layer 12 not oxidized in the oxidation process are beneath the MTJ components 13a and the bottom oxide layer 17, and serve as bottom electrodes 12a for the respective MTJ components 13a.

Figures 2F, 2G:
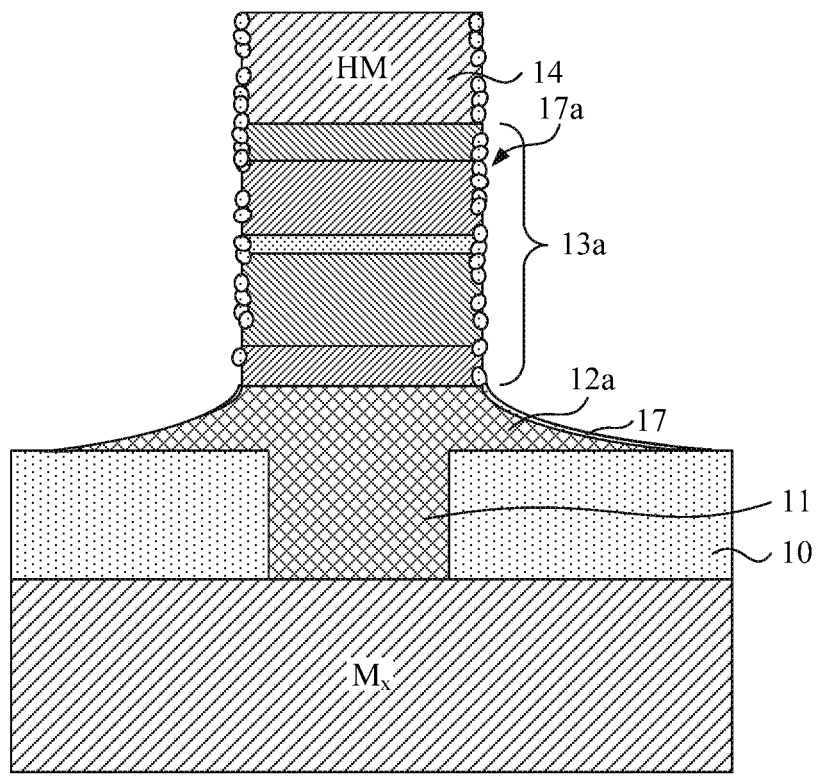

As shown in FIG. 2F, a second etching is then carried out to remove the sidewall oxide layers 16. The second etching is performed at an incident etching angle of smaller than 45°. The second etching may be implemented as, for example, an ion beam etching (IBE) process. The small incident etching angle of the second etching allows the ion beam to easily access the gaps around the MTJ components 13a, thus avoiding the problem caused by shadowing and making the method suitable for use in MRAM fabrication at different process nodes. Optionally, the incident etching angle of the second etching may be greater than the incident etching angle of the first etching in order to facilitate etching of the sidewalls of the MTJ components 13a. In addition, etching power applied in the second etching may be smaller than that used in the first etching in order to avoid bringing damage to the sidewalls of the MTJ components 13a. As a result of the second etching, the sidewall oxide layers 16 on the sidewalls of the MTJ components 13a are substantially stripped away, and damaged portion of the sidewalls of the MTJ components 13a is also removed, resulting in improved reliability of the MTJ components 13a being fabricated. In this embodiment, as another result of the second etching, at least a partial thickness of the bottom oxide layer 17 around the MTJ components 13a is removed. For example, a portion of the bottom oxide layer 17 may be etched through, resulting in exposure of the underlying first dielectric layer 10. In this process, the portion of the etching byproducts removed from the bottom oxide layer 17 may be redeposited onto the sidewalls of the MTJ components 13a, resulting in the formation of an oxide redeposition 17a. Since the bottom oxide layer 17 is an insulating material, the redeposition resulting from the etching of the bottom oxide layer 17 will not increase the risk of short-circuit points in the MRAM being fabricated. A thinner portion of the bottom oxide layer 17 (e.g., with a thickness of smaller than 5 nm) may remain around the MTJ components 13a from the second etching.

As shown in FIG. 2G, optionally, after the completion of the second etching, another etching, i.e., a third etching may be preformed. An incident etching angle of the third etching may be greater than the etching angle of the second etching. The incident etching angle of the third etching may be, for example, greater than 45° in order to remove the oxide redeposition 17a formed on the sidewalls of the MTJ components 13a in the second etching. Etching power applied in the third etching may be smaller than or equal to that used in the second etching. In the third etching, the bottom oxide layer 17 remaining around the MTJ components 13a may be etched, and a small portion of the removed material may be deposited on the sidewalls of the MTJ components 13a. Since the bottom oxide layer 17 is an insulating material, it will not lead to an increase in the risk of short-circuit points in the MRAM being fabricated. The third etching will narrow the coverage of the bottom electrodes 12a beneath the MTJ components 13a (i.e., a footing flare size of the bottom electrodes).

Figure 2H:
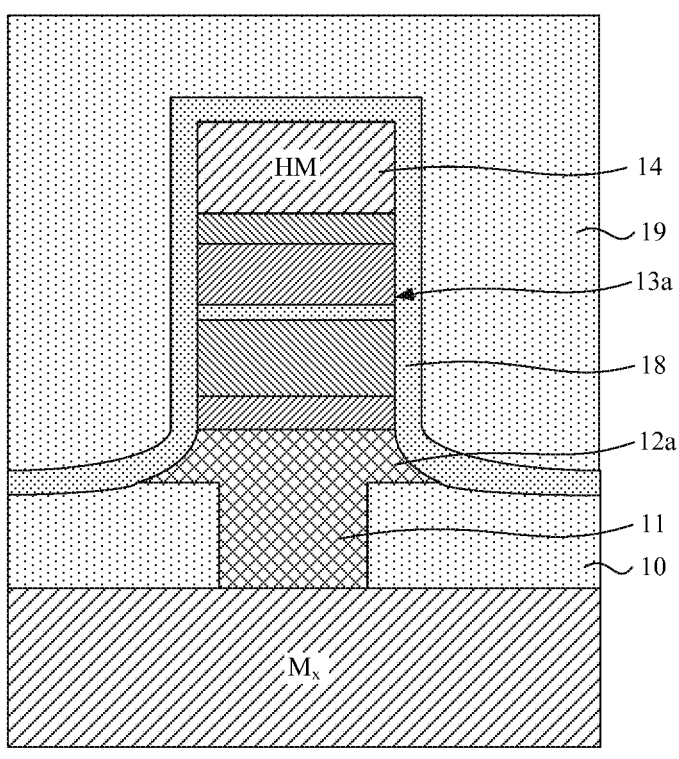

Next, the MTJ components may be encapsulated. As shown in FIG. 2H, an encapsulation material layer 18 may be formed by deposition over the top surface of the semiconductor substrate that has undergone the second etching (or the third etching). The encapsulation material layer 18 may be formed of, for example, $SiN_x$, SiON, $SiO_x$, SiC, SiCN or other suitable materials. A second dielectric layer 19 may be then formed on the encapsulation material layer 18 which covers the MTJ components 13a and the gaps surrounding them. Afterwards, the top surface of the second dielectric layer 19 may be planarized (e.g., by chemical mechanical polishing (CMP)).

Figure 2I:
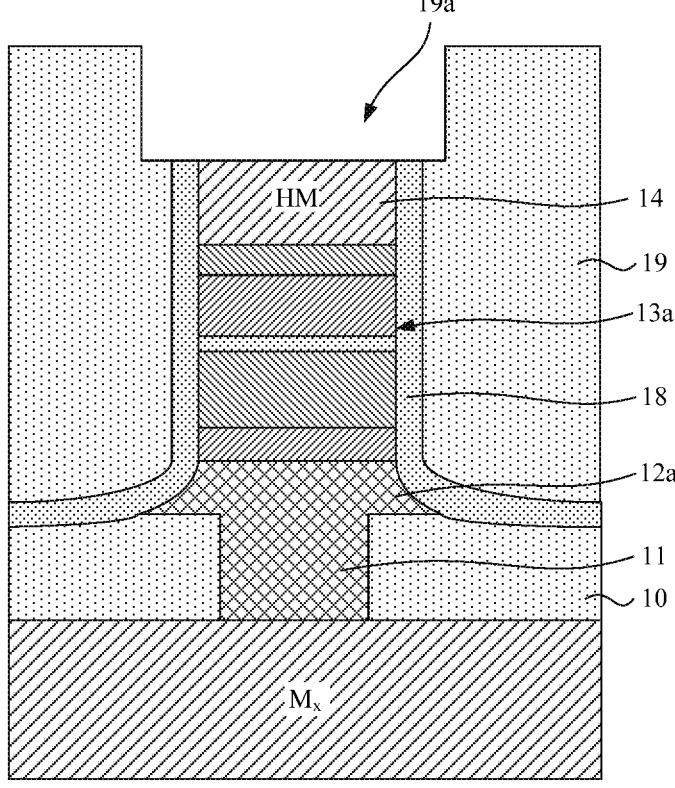

As shown in FIG. 2I, photolithography processes are then performed to form openings 19a in a top surface of the second dielectric layer 19, in which the top electrodes are exposed. Here, the top electrodes are formed from the hard mask layer 14. The openings 19a may be wider than the MTJ components 13a, and the encapsulation material layer 18 is also exposed in the openings 19a, wherein the exposed surface of the encapsulation is flush to the exposed surface of the top electrodes.

Figure 2J:
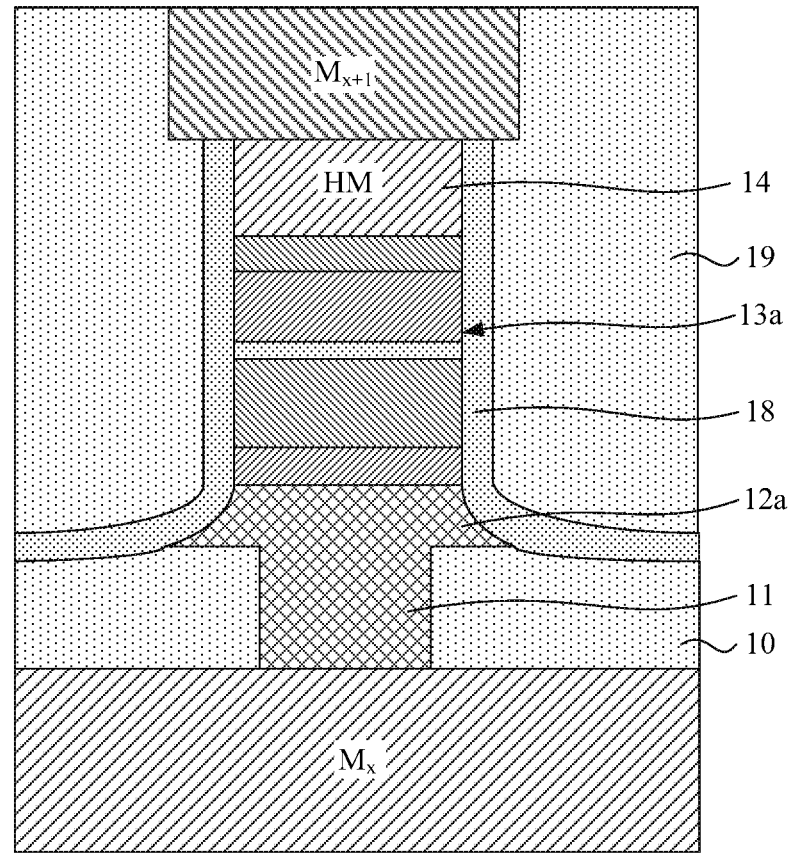

As shown in FIG. 2J, a metal material is then deposited into the openings 19a and on the top surface of the second dielectric layer 19, and a planarization process follows to remove the excess metal material to remain metal material in the openings 19a. That may provide upper metal layers $M_{x+1}$ serving as upper contact terminals for the MTJ components 13a.

FIGS. 3A to 3J are schematic cross-sectional views of structures resulting from multiple steps in a method for fabricating another embodiment of the present invention. Hereby, some components described in the same way as in previous embodiment will not be repeated. Referring to FIGS. 3A to 3J, the method according to this embodiment includes the steps as detailed below.

Figure 3A:
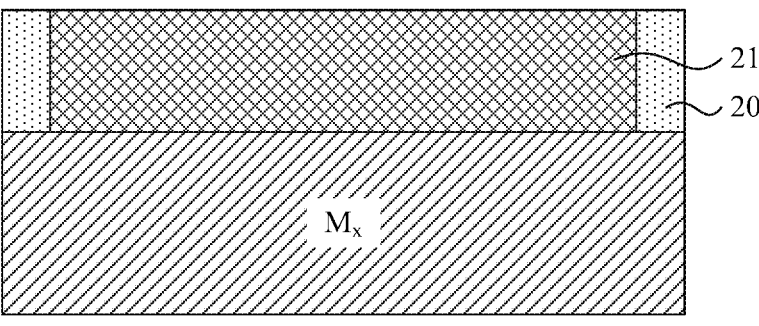
FIGS. 3A to 3I are schematic cross-sectional views of structures resulting from multiple steps in a method for fabricating a MRAM device according to another embodiment of the present invention.

As shown in FIG. 3A, first of all, a first dielectric layer 20 is formed over a lower metal layer $M_x$ on a semiconductor substrate (not shown), and a via 21 extending through the first dielectric layer 20. In this embodiment, the via 21 has a radial size that is greater than a lateral size of an MTJ component to be formed over the via 21. In the via 21, tantalum nitride (TaN) may be filled, for example. The MTJ component to be formed is aligned with a central region of the via 21 and brought into electrical contact with the via 21.

Figure 3B:
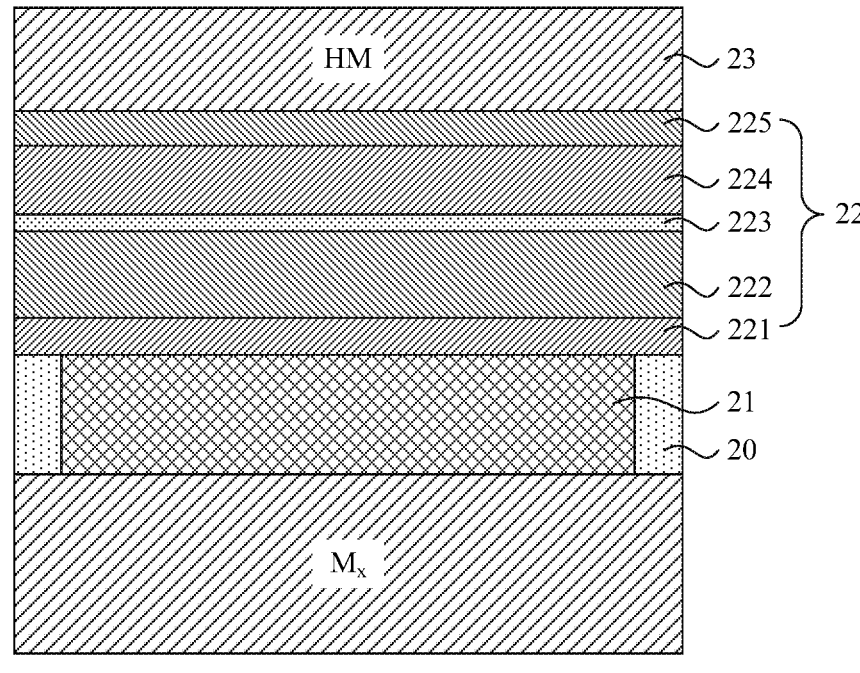

As shown in FIG. 3B, an MTJ stack 22 is then formed on the first dielectric layer 20. The MTJ stack 22 is intended to be processed to form the MTJ component which includes various functional layers required by the MTJ component. In another embodiment, the MTJ stack 22 may further include a bottom electrode layer between the seed layer 221 and the first dielectric layer 20. Following the formation of the MTJ stack 22, a hard mask (HM) layer 23 may be further deposited on the MTJ stack 22.

Figure 3C:
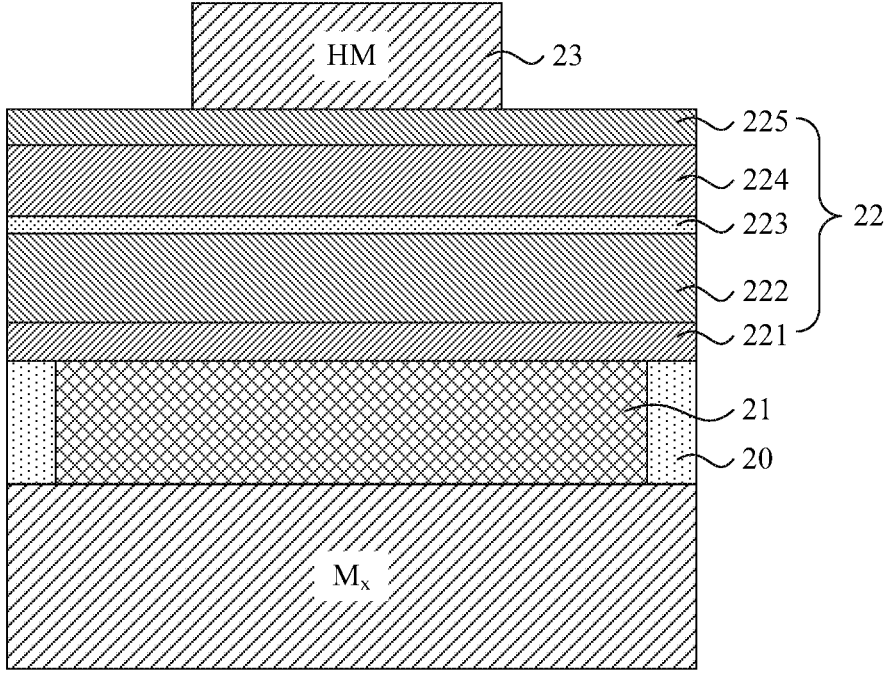
Figure 3D:
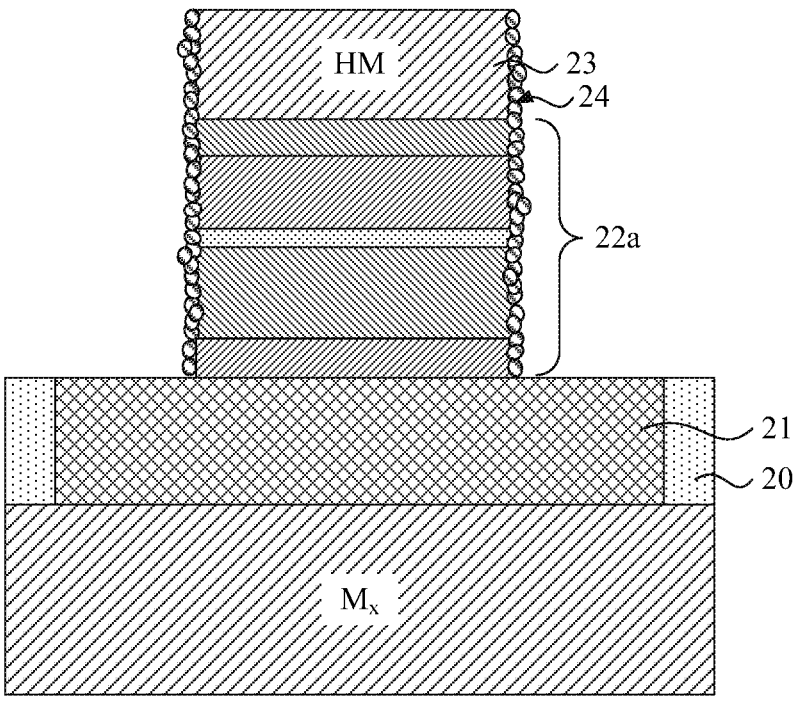

As shown in FIG. 3C, the hard mask layer 23 is then patterned by photolithography (e.g., reactive ion etching (RIE)) to define a location for the MTJ component. Refer to FIG. 3D, subsequently, with the patterned hard mask layer 23 serving as a mask, a first etching (which may include a proper degree of over-etching) is carried out. Specifically, the first etching may successively proceed through the various material layers in the MTJ stack 22 and optionally the bottom electrode layer between the MTJ stack 22 and the first dielectric layer 21 to remove a portion of the MTJ stack 22, resulting in the formation of the MTJ component 22a aligned with the central region of the via 21, with the remaining portion of the via 21 not covered by the MTJ component 22a being exposed. The first etching may be implemented as a reactive ion etching (RIE) or ion beam etching (IBE) process. Here, an ion beam etching (IBE) process may be chosen, for example. An incident etching angle of the first etching is, for example, smaller than 30°. For example, it may be a vertical etching (performed at an incident etching angle of 0°). Sidewalls of the MTJ component 22a are perpendicular to or nearly perpendicular to a top surface of the semiconductor substrate. As a result of the first etching, a conductive redeposition 24 is formed on the sidewalls of the MTJ component 22a.

Figure 3E:
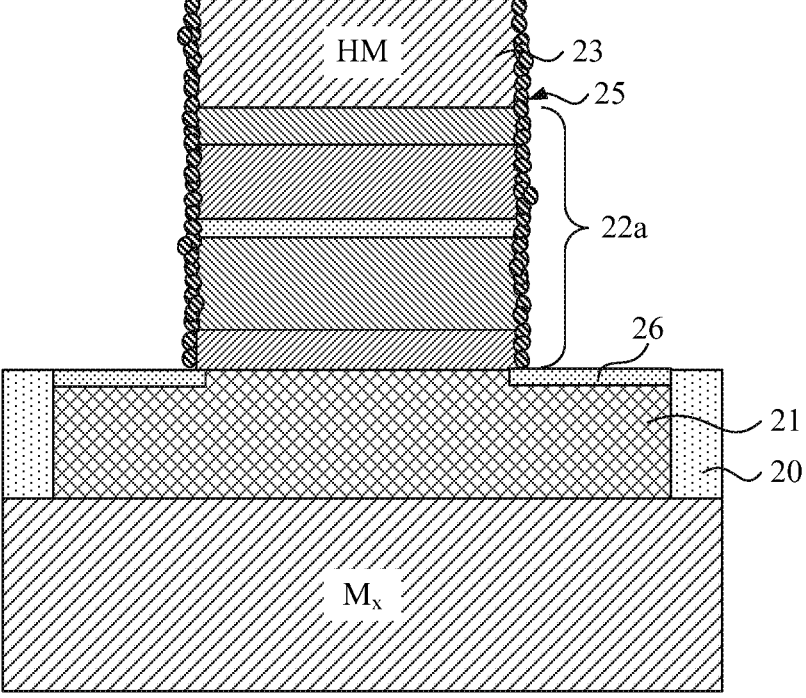

As shown in FIG. 3E, an oxidation process follows, in which, for example, oxygen ($O_2$), ozone ($O_3$), an inert gas containing oxygen ($O_2$) or ozone ($O_3$), or plasma is utilized to treat the semiconductor substrate that has undergone the first etching under or not under heating so that the conductive redeposition 24 on the sidewalls of the MTJ components 13a, as well as, magnetic material in the MTJ components 22a exposed at the sidewalls thereof in the oxidizing atmosphere, is oxidized, resulting in the formation of sidewall oxide layers 25 on the sidewalls of the MTJ components 22a. The oxidation process may alternatively form a part of the first etching. The oxidation process also causes the exposed portion of the via 21 to be oxidized from the surface thereof to a certain depth therein, resulting in the formation of a bottom oxide layer 26 (e.g., with a thickness of about 5-10 nm) around the MTJ components 22a. Due to the oxidation of the portion of the exposed surface of the via 21, there is substantially no exposed metal material around the MTJ component 22a.

Figure 3F:
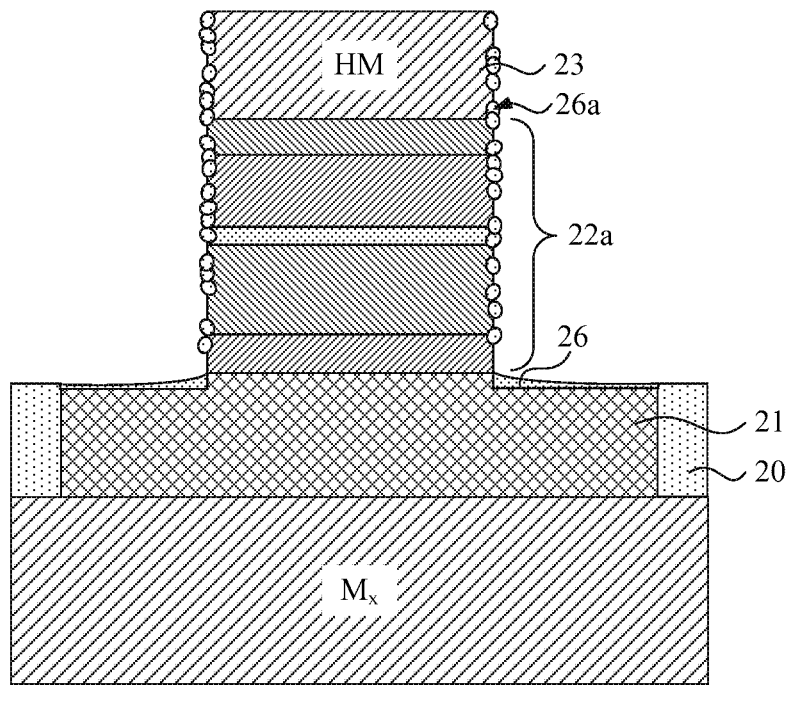

As shown in FIG. 3F, a second etching is then carried out to remove the sidewall oxide layers 25. The second etching is performed at an incident etching angle of smaller than 45°. The second etching may be implemented as, for example, an ion beam etching (IBE) process. The small etching angle of the second etching allows easy propagation of the ion beam used through gaps around the MTJ component 22a and irradiation thereof onto the sidewalls of the MTJ component 22a, thus avoiding the problem caused by shadowing and making the method suitable for use in MRAM fabrication at different process nodes. Optionally, the incident etching angle of the second etching may be greater than that of the first etching in order to facilitate etching of the sidewalls of the MTJ component 22a. In addition, etching power applied in the second etching may be smaller than that used in the first etching in order to avoid bringing damage to the sidewalls of the MTJ component 22a. As a result of the second etching, the sidewall oxide layers 25 on the sidewalls of the MTJ component 22a are substantially stripped away, and damaged portion of the sidewalls of the MTJ component 22a is also removed, resulting in improved reliability of the MTJ component 22a being fabricated. In this embodiment, as another result of the second etching, at least a partial thickness of the bottom oxide layer 26 around the MTJ component 22a is removed. In this process, etching byprod- ucts generated from the removed portion of the bottom oxide layer 26 may be redeposited onto the sidewalls of the MTJ component 22a, forming an oxide redeposition 26a. Since the bottom oxide layer 26 is an insulating material, the redeposition resulting from the etching of the bottom oxide layer 26 will not lead to an increase in the risk of short- circuit points in the MRAM being fabricated. A portion of the bottom oxide layer 26 (e.g., about 5 nm) may remain around the MTJ component 22a from the second etching and serves as a bottom spacer for the MTJ component 22a.

Optionally, a third etching with a larger incident etching angle, for example, of greater than 45°, may follow the second etching to remove the oxide redeposition 26a formed on the sidewalls of the MTJ component 22a in the second etching. Etching power applied in the third etching may be smaller than or equal to that used in the second etching.

Figure 3G:
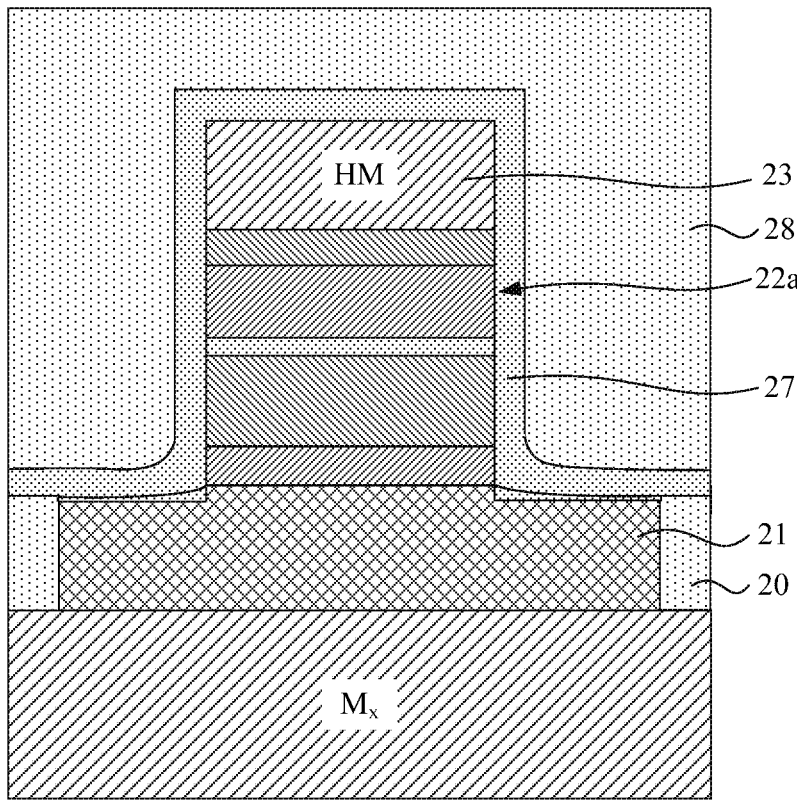

Next, the MTJ component 22a may be encapsulated. As shown in FIG. 3G, an encapsulation material layer 27 may be formed by deposition over the top surface of the semi- conductor substrate that has undergone the second etching (or the third etching). A second dielectric layer 28 may be then formed on the encapsulation material layer 27 to cover the MTJ component 22a and the gaps therearound. After- wards, the top surface of the second dielectric layer 28 may be planarized (e.g., by chemical mechanical polishing (CMP)).

Figures 3H, 3I:
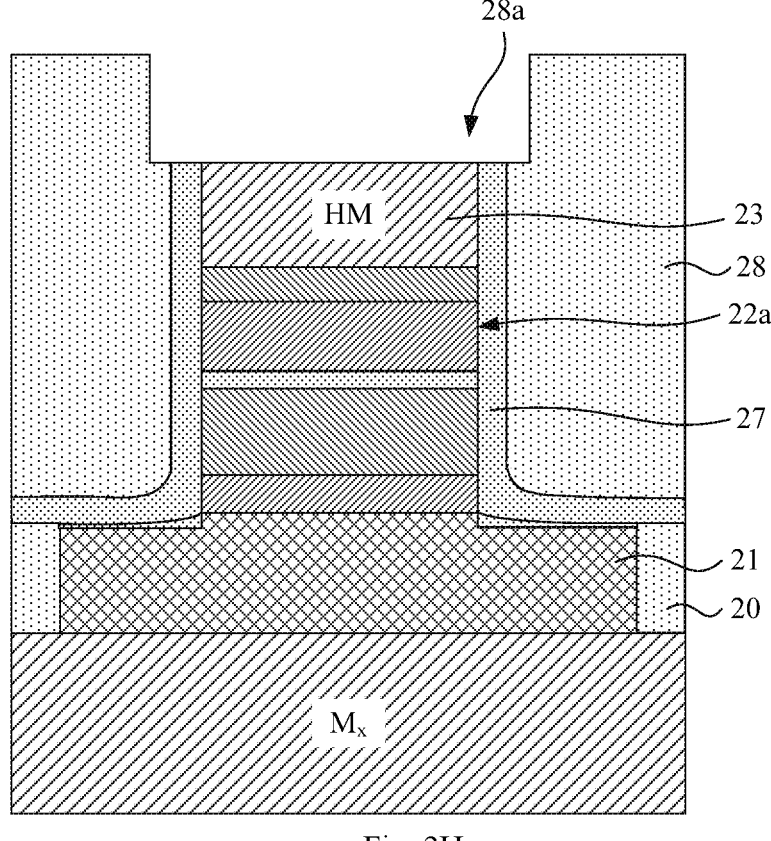

As shown in FIG. 3H, photolithography process is then used to form at least one opening 28a in a top surface of the second dielectric layer 28, in which the top electrode is exposed. The opening 28a may be wider than the MTJ component 22a and the encapsulation material layer 27 is also exposed in the opening 28a, wherein the exposed surface of the encapsulation is flush to the exposed surface of the top electrodes.

As shown in FIG. 3I, a metal material is then deposited into the opening 28a and on the top surface of the second dielectric layer 28, and a planarization process follows to remove the metal material above the opening 28a. As such, the remaining metal material in the opening 28a may provide an upper metal layers $M_{x+1}$ serving as upper contact terminals for the MTJ component 22a.

Embodiments of the present invention provide methods for fabricating at least one MRAM device, in which an MTJ stack is formed over a lower metal layer $M_x$ on a semicon- ductor substrate, and a first etching is then performed to form an MTJ component and cause a portion of the bottom electrode layer 12 or via 21 beneath the MTJ stack to be exposed. An oxidation process is then carried out to oxidize both a conductive redeposition on sidewalls of the MTJ component and the exposed portion of the bottom electrode layer or via around the MTJ component. Subsequently, a second etching is conducted at an incident etching angle of smaller than 45° to remove the resulting sidewall oxide layers on the MTJ component. The small incident etching angle of the second etching can avoid the problem caused by shadowing and facilitate complete removal of the sidewall oxide layers on the MTJ component, as well as damaged portions therefrom which may degrade the performance of the MTJ component, ensuring reliability of the MTJ com- ponent. In addition, as the MTJ component is surrounded by the oxidized bottom electrode layer or via, etching byprod- ucts redeposited on the sidewalls of the MTJ component during the second etching are non-conductive, reducing the risk of short-circuit points in the MRAM.

It is to be noted that the embodiments disclosed herein are described in a progressive manner, with the description of each embodiment focusing on its differences from others. Reference can be made between the embodiments for their identical or similar parts.

The foregoing description is merely that of several pre- ferred embodiments of the present invention and is not intended to limit the scope of the claims of the invention in any way. Any person of skill in the art may make various possible variations and changes to the disclosed embodi- ments in light of the methodologies and teachings disclosed hereinabove, without departing from the spirit and scope of the invention. Accordingly, any and all such simple varia- tions, equivalent alternatives and modifications made to the foregoing embodiments based on the essence of the present invention without departing from the scope of the embodi- ments are intended to fall within the scope of protection of the invention.

What is claimed is:

1. A method for fabricating at least one MRAM device, comprising:

forming a first dielectric layer over a lower metal layer on a semiconductor substrate;

forming a via extending through the first dielectric layer and a bottom electrode layer filling the via and covering the first dielectric layer, wherein the bottom electrode layer is connected to the lower metal layer through the via;

forming a magnetic tunnel junction (MTJ) stack on the bottom electrode layer;

performing a first etching on the MTJ stack to form an MTJ component aligned with the via and to expose a portion of the bottom electrode layer around the MTJ component, wherein a conductive redeposition is formed on sidewalls of the MTJ component during the first etching;

performing an oxidation process to form a sidewall oxide layer on each sidewall of the MTJ component by oxidizing the conductive redeposition and to form a bottom oxide layer around the MTJ component by oxidizing the exposed portion of the bottom electrode layer around the MTJ component, wherein a portion of the bottom electrode layer that is not oxidized and located beneath the MTJ component and the bottom oxide layer serves as a bottom electrode; and removing the sidewall oxide layer by a second etching, wherein the second etching is performed at an incident etching angle of smaller than 45°.

2. The method of claim 1, wherein after the second etching is completed, the method further comprises:

performing a third etching to remove etching by-products redeposited on the sidewalls of the MTJ component during the second etching, wherein the third etching is performed at an incident etching angle that is greater than the etching angle of the second etching.

3. The method of claim 1, wherein after the second etching is completed, the method further comprises:

forming an encapsulation material layer over a top surface of the semiconductor substrate that has undergone the second etching;

forming a second dielectric layer on the encapsulation material layer, wherein the second dielectric layer covers the MTJ component and fills gaps around the MTJ component;

planarizing a top surface of the second dielectric layer;

forming an opening in the second dielectric layer to expose a top electrode formed above and connected to the MTJ component; and forming an upper metal layer in the opening.

4. The method of claim 1, wherein the first etching is implemented as a reactive ion etching or an ion beam etching, and the second etching is implemented as an ion beam etching.

5. The method of claim 1, wherein a plurality of vias are formed extending through the first dielectric layer, wherein after the first etching is performed, a plurality of MTJ components are formed in alignment with the respective vias, and portions of the bottom electrode layer is exposed in gaps between the MTJ components, and wherein after the oxidation process is performed, the portions of the bottom electrode layer in the gaps between the MTJ components is oxidized.

6. The method of claim 1, wherein before the oxidation process is performed, the bottom electrode layer has a minimum thickness of smaller than or equal to 10 nm.

7. The method of claim 1, wherein a radial size of the via is smaller than a lateral size of the bottom electrode.

8. An MRAM device fabricated according to claim 1, comprising:

the first dielectric layer, formed over the lower metal layer on the semiconductor substrate;

the via, extending through the first dielectric layer;

the bottom electrode layer, filling the via and covering the first dielectric layer, wherein the bottom electrode layer is connected to the lower metal layer through the via;

the magnetic tunnel junction component, formed on the bottom electrode layer;

a hard mask, formed on the MTJ component;

a top electrode, formed above the hard mask and connected to the MTJ component;

an encapsulation material layer, formed on side walls of the MTJ component and an exposed surface of each of the bottom electrode layer and the first dielectric layer;

a second dielectric layer, formed on the encapsulation material layer, wherein the second dielectric layer covers the MTJ component and fills gaps around the MTJ component.

9. The MRAM device of claim 8, wherein a radial size of the via is smaller than a lateral size of the bottom electrode.

10. A method for fabricating at least one MRAM device, comprising:

forming a first dielectric layer over a lower metal layer on a semiconductor substrate and a via extending through the first dielectric layer;

forming a magnetic tunnel junction (MTJ) stack on the first dielectric layer;

performing a first etching on the MTJ stack to form an MTJ component aligned with a central region of the via and to expose a portion of the via around the MTJ component, wherein a conductive redeposition is formed on sidewalls of the MTJ component during the first etching;

performing an oxidation process to form a sidewall oxide layer on each sidewall of the MTJ component by oxidizing the conductive redeposition, and to form a bottom oxide layer by oxidizing a portion of the via exposed around the MTJ component; and removing the sidewall oxide layer by performing a second etching on the MTJ component, wherein the second etching is performed at an incident etching angle of smaller than 45°.

11. The method of claim 10, wherein after the second etching is completed, the method further comprises:

performing a third etching to remove etching byproducts redeposited on the sidewalls of the MTJ component during the second etching, wherein the third etching is performed at an incident etching angle that is greater than the incident etching angle of the second etching.

12. The method of claim 10, wherein after the second etching is completed, the method further comprises:

forming an encapsulation material layer over a top surface of the semiconductor substrate that has undergone the second etching;

forming a second dielectric layer on the encapsulation material layer, wherein the second dielectric layer covers the MTJ component and fills gaps around the MTJ component;

planarizing a top surface of the second dielectric layer;

forming an opening in the second dielectric layer to expose a top electrode formed above and connected to the MTJ component; and forming an upper metal layer in the opening.

13. The method of claim 10, wherein the first etching is implemented as a reactive ion etching or an ion beam etching, and the second etching is implemented as an ion beam etching.

14. The method of claim 10, wherein a plurality of vias are formed extending through the first dielectric layer, wherein after the first etching is performed, a plurality of MTJ components are formed in alignment with the respective vias, and a portion of each via is exposed in gaps between the MTJ components; and wherein after the oxidation process is performed, the portion of each via in the gaps between the MTJ components is oxidized.

* * * * *